United States Patent [19]
Herbst

[11] Patent Number: 5,913,110
[45] Date of Patent: Jun. 15, 1999

[54] METHOD FOR PRODUCING A PLASTIC MATERIAL COMPOSITE COMPONENT, A PLASTIC MATERIAL COMPOSITE COMPONENT AND A MOLD FOR INJECTION MOLDING SAME

[76] Inventor: Richard Herbst, Freisinger Strasse 3b, D-85386, Eching, Germany

[21] Appl. No.: 08/806,812

[22] Filed: Feb. 26, 1997

[30] Foreign Application Priority Data

Feb. 26, 1996 [DE] Germany .................... 196 07 212

[51] Int. Cl.$^6$ .................... H01L 21/44; H01L 21/48; H01L 21/50
[52] U.S. Cl. .................... 438/126; 438/125; 438/127
[58] Field of Search .................... 438/126, 127, 438/125

[56] References Cited

U.S. PATENT DOCUMENTS

| | | | |
|---|---|---|---|
| 5,102,828 | 4/1992 | Marchisi | 438/124 |
| 5,106,785 | 4/1992 | Rauchmaul et al. | 438/127 |
| 5,200,366 | 4/1993 | Yamada et al. | 438/126 |
| 5,244,840 | 9/1993 | Kodai et al. | 438/127 |
| 5,728,606 | 3/1998 | Laine et al. | 438/127 |

*Primary Examiner*—Kevin M. Picardat
*Assistant Examiner*—Deven Collins
*Attorney, Agent, or Firm*—Knobbe, Martens, Olson & Bear LLP

[57] ABSTRACT

A method for producing a plastic material composite component and a corresponding component are disclosed. The component is typically a smart card having a semiconductor chip embedded in plastic material. The component is provided with a contact area on an outer component surface. Electrical interconnection between the contact area and the chip is effected during injection molding the component.

19 Claims, 5 Drawing Sheets

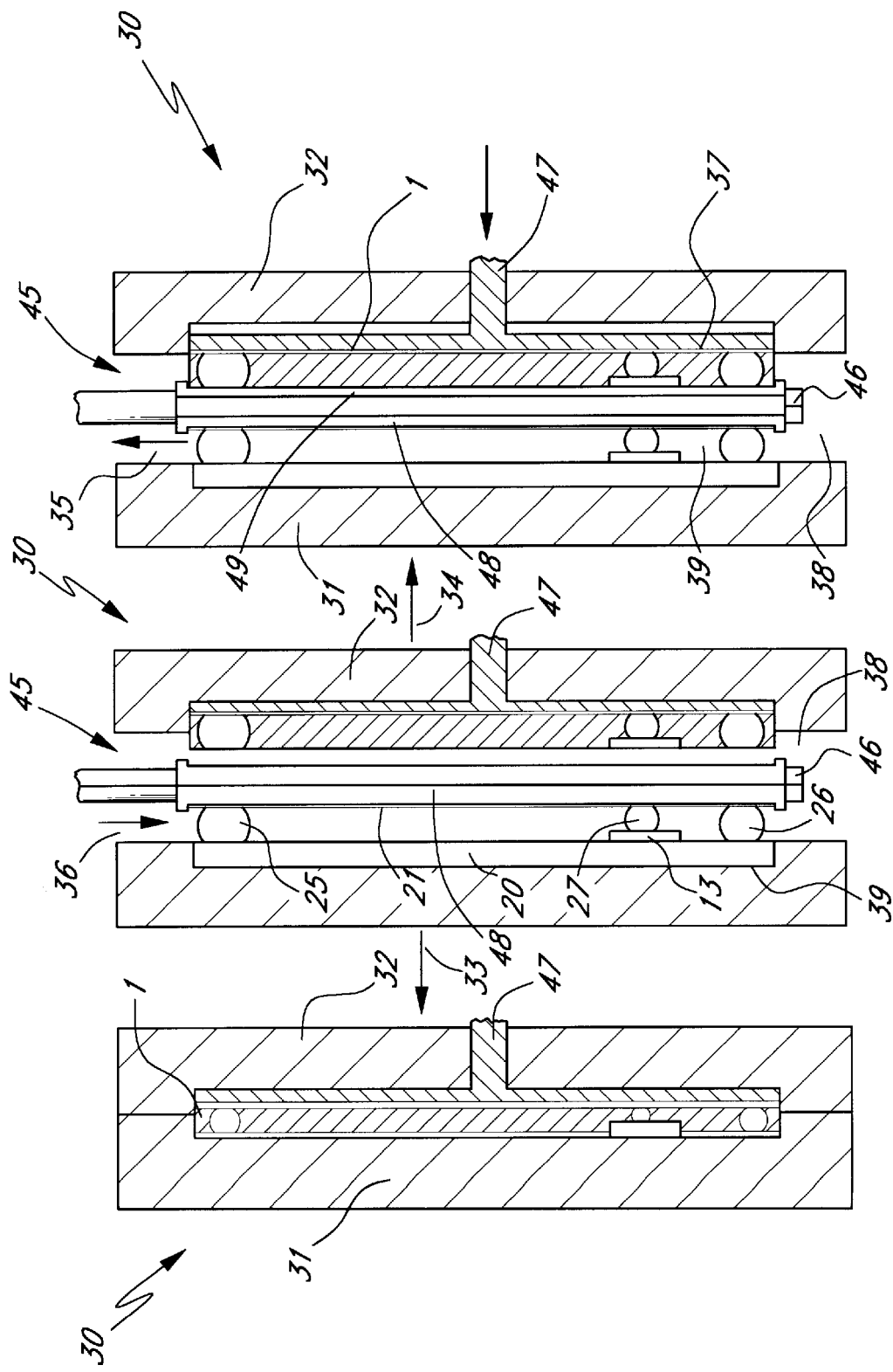

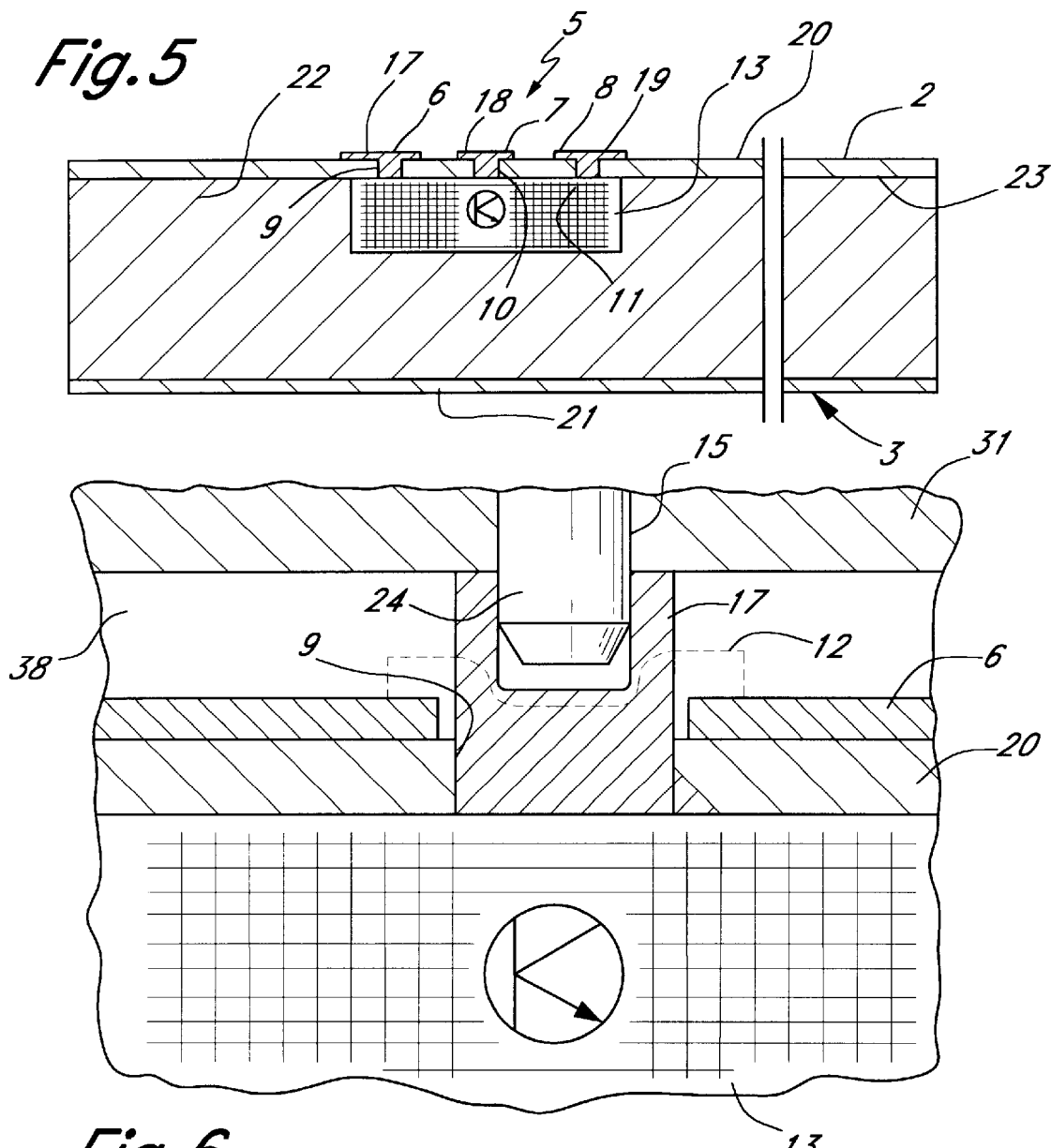
Fig. 5
Fig. 6
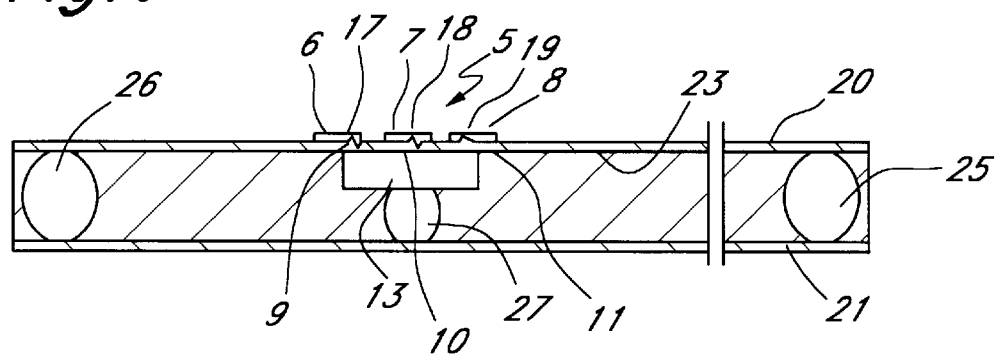
Fig. 7

METHOD FOR PRODUCING A PLASTIC MATERIAL COMPOSITE COMPONENT, A PLASTIC MATERIAL COMPOSITE COMPONENT AND A MOLD FOR INJECTION MOLDING SAME

FIELD OF THE INVENTION

The invention relates to a method for producing a plastic material composite component having a semiconductor chip embedded in the plastic material.

Further, the invention relates to a plastic material composite component comprising at least one label configuring a flat side of the component, and a chip embedded in a plastic material adjoining the label. A component of this kind may, for example, be a credit card or, still more specifically, a so-called smart card.

The invention, moreover, is related to a mold for injection molding a plastic material composite component of the kind described before.

BACKGROUND OF THE INVENTION

The invention relates to a method for producing a plastic material composite component during which a cavity in a plastic material injection molding machine is repleted with molten plastic material by injecting same and the chip is embedded in the plastic material. An electrical contact is made between the chip and a surface of the composite component.

Although the invention will hereinafter be described in relation to the production of so-called smart cards, it is to be understood that the invention is not limited to this field of application.

The term smart card is used to describe a plastic card with one or two laminated sides which usually carry some instructions and/or advertising printed thereon and/or certain safety features, for example a hologram, a magnetic strip, a photograph of the card holder, or the like. A module is embedded in the smart card. The module consists of an integrated semiconductor electronic circuit (chip) and, usually, of a contact-and-carrier plate carrying the chip. In the case of some cards, the chip coacts with a plurality of surface segments to form electric contacts that are accessible from the outside. In the case of other cards, antennas are provided in the card for the non-contact exchange of information, for example of data. Smart cards of that kind are employed as telephone cards, authentication cards for mobile communication equipment, as credit cards for money transfers, as authorization cards for medical insurance systems or the like.

The user of such cards introduces the smart card into, or moves past a card reader which thereby enters into communication with the electronic chip in the smart card via corresponding contacts or antenna means.

In order to enable smart cards to be simultanously used as advertising means, the smart cards preferably are produced in such a way that one or two films, preferably so-called labels, are employed to form one or both flat sides of the finished smart card. In this connection, the term "label" is understood to describe a film with, preferably, one printed side. The label carries the advertising imprint, or the like.

For producing the smart card, the label is introduced into the cavity of a plastic injection mold. For this purpose, the cavity has a flat, parallelepiped shape, and the labels are placed on the flat surfaces of the cavity.

The invention, further, is related to the production of similar cards, as have become known under the denomination "data-cards" or "PCMCIA". These cards are laminated on one or both flat sides with a metal foil or film and have the shape of a conventional credit card, however, are somewhat thicker so that even more complex electronic componentes may be embedded therein. Such data cards are used for securing data and are also used as access authorization elements for highest security standards. PCMCIA cards are, inter alia, used in portable electronic data processing and communication equipment, for example in notebooks and may contain a modem, supplemental memory or a standardized interface, for example for coupling the communication equipment to certain telephone or other data communication networks.

Such PCMCIA cards conventionally have a groove on a narrow front side, the groove, in turn, being internally equipped with female contact segments which, when the PCMCIA card is inserted into a corresponding PCMCIA slot, come into contact with corresponding male contact elements provided in the slot.

For producing either credit cards, smart cards or PCMCIA cards, molten plastic material is injected into an appropriate cavity of a mold. The plastic material may be any appropriate material, for example polystyrol, propylene, ABS or polycarbonate, resulting in a perfect adhesion between the labels and the plastic material after the termination of the injection process.

European patent document 0 399 868 discloses a process for manufacturing a smart card of the kind of interest. For doing so, the chip is first mounted on a metal band and is wired concurrently. The chip together with the metal band is then embedded in a plastic material so that a module is produced having a certain thickness. The module is configured such that its thickness corresponds to the height of the cavity within the mold. When the mold is closed a certain pressure is thus exerted on the module, fixing same at a certain predetermined position within the cavity.

According to this prior art method a contact area is provided being subdivided into certain segments according to the requirements of a specific application. The chip is connected to the segmented contact area by soldering its connectors onto individual segments of the contact area via contact wires. Subsequently, the chip and the contact area are embedded in a resin within a mold for producing the module which is then subsequently inserted between the foils and into the cavity, as described before. In a subsequent step the cavity is then repleted with plastic material by injecting same. In some applications an array of contact areas is arranged on a flat metal band or on an electrically conductive foil or film having the shape of a band. The chips are then individually bonded, are then subsequently embedded to generate modules and are finally separated from each other by cutting. This contacting of chips on bands is also known in the art as "tape-bonding".

Conventionally it had been considered as necessary to produce a module, i.e. the chip with its contact surface, as a separate element in order to be able to protect the chip against any adverse effects occurring during the manufacture of a smart card and in order to ensure a safe bonding with the contact area.

However, it is certainly disadvantageous that the modules are manufactured separately because this involves additional and time consuming production steps.

The prior art, further, has the disadvantage that the positioning of the module within the mold cavity may be guaranteed only with difficulties. The forces required for fixing the module within the cavity at a predetermined location may only be generated after the mold has been closed so that the modules might change their position during the closing of the mold.

It is, therefore, an object underlying the invention to improve a method, a component and a mold of the kind mentioned at the outset, so that the afore-mentioned disadvantages are obviated. In particular, the various method steps that are required for the production of such components shall be reduced in number and shall be simplified in order to enable a reliable and economical production.

These and other objects of the invention are achieved by a method for producing a plastic material composite component having a semiconductor chip embedded in the plastic material, the method comprising the steps of providing a plastic material injection mold having a cavity;

providing the chip in the cavity;

providing electrical connection elements in the cavity;

injecting molten plastic material into the cavity, thereby embedding the chip in the plastic material and simultaneously arranging the chip and the connection elements such that an electric contact is fixed between the chip and a surface of the cavity when the chip is arranged in the cavity.

The objects are, further, achieved by a plastic material composite component comprising at least one label configuring a flat side of the component, and a chip embedded in a plastic material adjoining the label, the chip being mounted on a carrier element and the carrier element being attached to the label, a contact surface being provided on the component, the chip having contact bumps electrically connected to the contact surface by soldering or riveting.

Moreover, the above-mentioned objects are achieved by a mold for injection molding a plastic material composite component having a chip embedded therein by injecting a molten plastic material into a cavity of the mold after inserting the chip into the cavity, the mold comprising:

a first mold portion;

a second mold portion adjoining the first mold portion with the cavity therebetween when the mold is in a closed operational position;

means for inserting the chip into the cavity when the mold is in an open operational position;

means for mechanically making an electrical contact between the chip and a contact surface on the component when the chip is arranged in the cavity, the contact making means being provided in the first mold portion and extending through an opening in the cavity.

The object underlying the invention is thus entirely achieved.

The invention makes the separate production of modules superfluous in which the modules are produced by embedding the chips and a contact area in a resin. Nevertheless, a precise and reliable contact between the chip and the surface of the composite component is achieved during the injection of the molten plastic material into the mold cavity.

Therefore, the production of such components is highly simplified because several production steps may be deleted and, further, it is only necessary to precisely insert the chip into the cavity and hold same on that position during the injection process.

According to the invention, the contact is fixed during the injection process, i.e. it is finally arranged because the corresponding contact elements had been inserted loosely into the cavity before.

In any case it is possible to insert the chip into the plastic material during the injection of the latter or to insert it into the cavity prior to injection.

In the scope of the present invention the term "chip" is to be understood in a broad sense and may comprise individual electronic components or assemblies or arrays of such components. In the colloquial language the term "chip" is normally related to an electronic component where the semiconductor substrate, i.e. the wafer, is entirely encapsulated in a plastic material housing and its contacts are bonded to mechanical contacts or contact tongues by well-known techniques. Although the present invention envisages to use such commercially available elements, it is also considered to use the wafers by themselves, i.e. wafers that have not already been embedded in a plastic material housing.

According to the invention it is preferred to use a semiconductor component having contact bumps on its surface and to embed same into the plastic material without surrounding the semiconductor component with another plastic material before.

This results in a further reduction of manufacturing steps, i.e. the manufacture of a housing or a module and, hence, results in substantial savings of time and money. Further, even smaller dimensions become possible because no separate and space consuming housings for the chips or the modules are required.

According to an embodiment of the invention the contacting itself is made during the injection time.

This feature has the advantage that a further step, i.e. the separate manufacture of the contact becomes superfluous. Therefore, a further reduction in cycle step and a further reduction of costs is achieved.

According to another embodiment of the invention the chip is arranged on a foil, film or a label which, later on, constitutes a flat side of the composite component. The chip and the label are synchronously inserted into the mold cavity.

The positioning of the label together with the chip may be made conventionally by applying a vacuum, by applying electrostatic forces or the like. As the position of the foil may be easily ensured when inserted in the cavity, the position of the chip is also ensured because the chip is fixedly attached to the label.

Therefore, in contrast to the prior art it is not necessary to use two separate positioning steps, one for the label and one for the module and no further steps must be taken to guarantee that the module will remain on its particular position. Thus, the position of the chip on the foil and, hence, within the cavity may even be guaranteed during the closing of the tool.

According to an alternate embodiment of the invention, the chip is not attached to the label prior to the beginning of the injection cycle. Instead, the chip is mounted on a part of the mold, for example by applying an appropriate adhesive and gluing the the chip on the tool.

In a preferred embodiment of the invention the chip has bumps on its surface and is electrically connected to the contact area.

This feature has the advantage that the contact bumps may be geometrically located accordingly so that they may immediately be soldered or connected by pressure to a corresponding counter-surface, thus establishing an electrically conductive connection. The contact bumps may be inserted into corresponding openings in the label. In such a way an electrically conductive connection to the contact area may be established without the need of a complex bonding process as used in the prior art where fine wires are bonded to the contact bumps on the semiconductor substrate.

It goes without saying that the term "contact bumps" shall include any contact points on the surface of the chip and may substantially vary in their specific design, depending from the particular chip or varying between various chip manufacturers. However, contact bumps are conventionally configured so as to withstand certain mechanical stress so that they may be soldered with a soldering agent melting at low temperatures or may be bonded accordingly.

The contact area itself may be generated either before or during the injection process. The generation of the contact area after the injection process is particularly preferred because during the injection process the fixing of the contacting occurs, i.e. the electrically conductive connection between the contact bumps and the composite component outside surface. Therefore, after the injecting the contact area may be manufactured particularly simply and may be connected with the contact. Further, it is also possible to only mechanically prearrange the contact during the injection and to complete same after the injection.

In a particularly preferred embodiment of the invention the contact bumps are configured as rivets being riveted with the label during the injection process. The rivets may preferably be designed as hollow rivets which can be deformed and thus riveted with appropriate dies or swages, provided on the injection mold.

In another preferred embodiment of the invention the chip may be attached to the label by simply inserting its contact bumps into corresponding openings in the label.

The chip may, however, also be glued to the label or may be soldered thereto. Further, the chip may also be applied to the label under the action of a spring. This may be made particularly if the label is a metallic foil.

If metallic foils are used, the chip is simultaneously screened against electromagnetic fields.

The metallic foil may comprise contact segments, thus enabling to use the metallic foil itself for the generation of the contact area.

The particular design of the segmented contact area may be effected by laser cutting, edging or other conventional methods as printing, galvanic deposition, vapor deposition or the like.

According to a further embodiment of the invention the contact bumps are plastically deformed during the printing of the contact area.

In some embodiments of the invention the chip is mounted to a carrier element. The carrier element may provide a mechanical of thermal protection of the chip during the subsequent injection process.

In preferred embodiments of the invention the label is connected with a second, parallel label, connected together in a sandwich arrangement.

If the electrical connection between the chip and the contact area on the surface of the composite component is made by soldering, it is particularly preferred to effect the soldering under the action of the heat being dissipated anyway by the hot molten plastic material injected into the cavity. The soldering is, thus, effected by itself without the necessity of using separate soldering equipment.

If the contact shall be made by riveting, it is preferred to arrange an appropriate riveting tool or swage on one of the mold portions in order to enable riveting during the production of the components, for example during the production of smart cards or PCMCIA cards.

It goes without saying that the features, mentioned before and those that will be explained hereafter, cannot only be used in the particular given combination but also in other combinations or alone without departing from the scope of the present invention.

BRIEF DESCRIPTION OF THE DRAWINGS

Further features and advantages of the invention will become apparent from the subsequent description of preferred embodiments together with the Figures.

FIG. 2 is a schematic view of a plastic material injection mold having two mold portions, as can be used for manufacturing the smart card of FIG. 1, the mold being in a first operational position;

FIG. 3 an illustration similar to that of FIG. 2, however, for a second operational position;

FIG. 4 another illustration, similar to that of FIG. 2, however, for a third operational position;

FIG. 5 a sectional view of a first embodiment of a composite component in enlarged scale;

FIG. 6 a detail of a composite component in the area of a contact bump together with the corresponding swage in a plastic material injection mold, on further enlarged scale;

FIG. 7 a sectional view of another modification of a composite component;

DETAILED DESCRIPTION OF THE PREFERRED EMBODIMENTS

Figure 1:
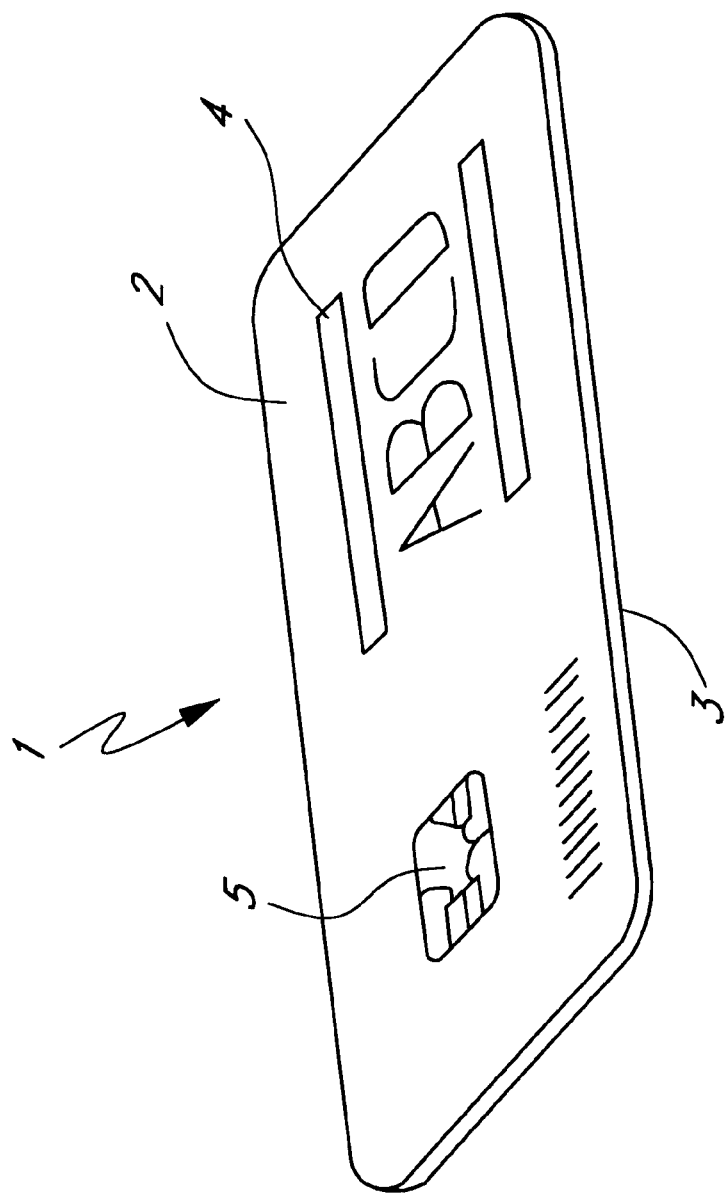
FIG. 1 is a schematic view of a composite component, namely a smart card.

In FIG. 1 reference numeral 1 designates a composite component according to the invention, for example a smart card of the type described at the outset.

The composite component is provided with an imprint 4 on its upper surface 2 and/or on its lower surface 3.

A contact area 5 is provided at a predetermined location of the composite component. The contact area 5 conventionally consists of contact segments, as schematically shown in FIG. 1.

In component 1 first surface 2 and/or second surface 3 may be configured by a label. A chip having an electronic circuitry is embedded in component 1. The chip is electrically connected to contact area 5 on surface 2 of the label.

The remaining area between the labels and the chip is repleted with a plastic material mass.

The injection process shall now be briefly explained with reference to FIGS. 2–4. FIG. 2 schematically depicts a plastic material injection mold 30 having a first, left mold portion 31 as well as a second, right mold portion 32. The corresponding installations for opening and closing, respectively, mold 30, as well as assemblies for feeding plastic material 22 to mold 30 are not shown for the sake of clarity. A handling system for loading and unloading, respectively, mold 30 is schematically indicated with reference numeral 45.

As can be seen from FIG. 2 a composite component 1 having been manufactured during the preceding cycle is still arranged in mold 30.

Mold 30 is now opened by displacing mold portions 31 and 32 along arrows 33, 34 in a lateral direction. Concurrently, an arm 46 of handling system 45 is introduced into the opening gap between mold portions 31, 32, the handling system 45 being a structural part of a robot. In the shown example only the front portion is depicted having gripping or other attracting components for loading a semi-finished element 1' on the one side and for unloading a manufactured component 1 on the other side. Arm 46 is provided with two gripping elements being displaceable with respect to each other along double arrow 44, as indicated by numerals 48 and 49 and may be provided with additional attracting elements.

Semi-finished product 1' consists of two labels 20, 21 being connected at one end thereof by means of glue points 25, 26. Chip 13 adjoins label 20 and is, further, connected to opposing label 21 by means of another glue point 27.

Hence, labels 20, 21 and chip 13 are configured as a sandwich that may easily be handled due to the connection of the aforementioned elements through glue points 25–27. The sandwich may be held by arm 46 or gripping element 48, respectively and may be inserted into cavity 38 between mold portions 31, 32 along arrow 36.

During that period of time the composite component having been manufactured during the preceding cycle is still located within the cavity of second mold portion 32. As soon as arm 46 has come to its terminal position between the two mold portions 31, 32 (FIG. 3) gripping element 48 will be displaced in a direction towards left mold portion 31 for transferring semi-finished 1' into the cavity 39 in the left mold portion. Such transfer may be assisted by blowing air.

Concurrently, an ejector 47 in the right mold portion 32 is actuated, thus ejecting component 1 from cavity 37 within right mold portion 32. Ejected component 1 is picked up by gripping element 49 on arm 46 which, for that purpose, is slightly displaced in the direction of second mold portion 32 as shown in FIG. 4. The transfer of component 1 may be assisted by blowing or sucking air.

Gripper elements 48, 49 are then again moved together and arm 46 is then displaced along arrow 35 for entirely leaving the gap between mold portions 31, 32. Ejector 47 is retracted and mold portions 31, 32 may be closed as soon as arm 46 has entirely left gap 38.

In a subsequent phase following the phase of FIG. 4 cavity 38 between mold portions 31, 32 is repleted by injecting molten plastic material. The molten plastic material exerts a pressure on chip 13 and presses same against the inner surface of mold 30.

The structure of composite component shall now be described in relation to the subsequent Figures. Like elements are insofar designated with the same reference numerals.

Chip 13 adjoins the inner surface of label 20. Label 20 is provided with three openings 9, 10, 11. Contact bumps 17, 18, 19 being provided on the surface of chip 13 extend through openings 9, 10, 11. During the injection molding these contact bumps 17, 18, 19 or elements had been riveted onto the exterior surface 2 of label 20 so that chip 13 was simultaneously mechanically attached to label 20 during the injection.

Contact area 5 consists of three contact segments 6, 7, 8 which have been applied over contact bumps 17, 18, 19 subsequently by printing an electrically conductive paste thereon, as shown in FIG. 5. However, this printing may already have occurred previously.

FIG. 6 is an illustration on further enlarged scale showing how the contact bumps 17, 18, 19 had been plastically deformed and, hence, riveted to label 20 through the closing of mold portion 31, 32 during the injection process.

As can be seen from FIG. 6, contact bumps 17 prior to the beginning of the injection process have an essentially hollow cylindrical shape and extend outwardly through corresponding openings 9 in label 20.

Whereas in the embodiment of FIG. 5 the contact segments had been established after the riveting, in the embodiment of FIG. 6 the surface of label 20 has been previously metallized in a desired pattern for generating the various contact segments of contact area 5.

According to FIG. 6 an appropriate die or swage 24 being displaceable relative to mold portion 31 enters into the cavity of contact bump 17 during the injection process and deforms the hollow cylindrical wall during further closing of the tool, thus generating the final shape of the rivet, as indicated by dashed line 12 in FIG. 6. The external edge of contact bump 17 is, thus, riveted on contact segment 6, concurrently ensuring a permanent and safe contact between chip 13 and contact segment 6.

Mold portion 31 is provided with one swage or die for each of the contact bumps so that all of the contact bumps are simultaneously riveted during the closing of mold portions 31, 32. It goes without saying that the shape of contact bumps 17, 18, 19 may vary during the riveting and that die 24 may be designed slightly conically in order to assist a widening and a plastic deformation of the hollow rivet.

It is possible to withdraw die 24 after the riveting step actively, for example with a hydraulic unit. However, also a passive retraction may be effected through the pressure exerted by the plastic material mass on chip 13, resulting in a certain plastic post-deforming and widening of the rivet so that only minor depressions result in the center of the rivet, as indicated in FIG. 6 by dashed line 12.

In the embodiment of FIGS. 5 and 6 the fastening of chip 13 on label 20 may be effected by simply extending contact bumps 17, 18, 19 through apertures or openings 9, 10, 11 in label 20.

FIG. 7 shows a modified embodiment.

This embodiment essentially corresponds to those briefly explained previously with regard to FIGS. 2–4. Chip 13 adjoins inner surface 23 of label 20. Its contact bumps 17, 18, 19 extend through openings 9, 10, 11 in label 20 and protrude therefrom.

Contact bumps 17, 18, 19 are designed as cones or tips. Chip 13 is connected to opposing label 21 by means of a glue point 27.

In the course of manufacture label 20 is first provided with the openings 9, 10, 11 and chip 13 is then attached thereto by pushing contact bumps 17, 18, 19 through openings 9, 10, 11. This is preferably made from above when label 20 is arranged on a support. One can then apply glue points 25, 26, 27 and then place second label 21 thereover.

According to the embodiments of FIGS. 5 and 7 the contact area is generated immediately thereafter on label 20.

Figure 8:
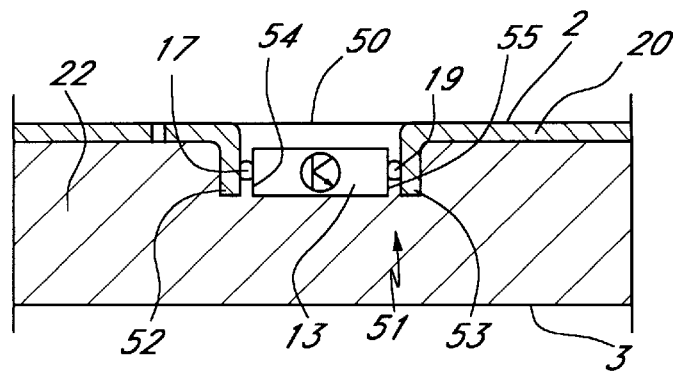
FIG. 8 another alternative of a composite component having only one label and having the chip on a narrow side between inwardly directed extensions of the label.

FIG. 8 shows another embodiment of the invention.

In contrast to the embodiments described before, label 20 having chip 13 thereon, consists of a metal.

Label 20 is provided with a recess 50, the edges of label 20 defining recess 50 wherein are directed inwardly to form a sleeve-shaped extension 51. Wall surfaces 52, 53 of sleeve-shaped extension 51 receive between them chip 13 with front surfaces 54, 55. Contact bumps 17, 19 are provided on front surfaces 54, 55 of chip 13 such that chip 13 with its contact bumps may elastically be received between wall surfaces 52, 53 of extension 51.

As label 20 is configured as a metal foil, it has a significantly higher stability so that the elasticity of extension 51 is sufficient for holding chip 13 safely during the subsequent injection process.

Contact bumps 17, 19 are provided with an easily melting soldering material and opposing wall surfaces 52, 53 may be treated the same way.

During the subsequent injection process the soldering material is molted under the action of the heat dissipated by the injected hot liquid plastic material.

The space between recess 50 in label 20 and chip 13 is entirely repleted by plastic material 22 during injection.

Metal foil 20 has preferably been pre-treated prior to attaching chip 13 thereto. For example, individual printed connector paths or contact segments may have been generated. The final separation between the contact segments of the contact area from the remaining portion of label 20 is preferably effected only after the termination of the injection so that the respective pieces will not fall apart. As an alternative, one could affix them previously to an adhesive band or the like.

After the composite component is manufactured, the individual contact segments may be separated from each other for example by laser cutting or etching or by mechanical methods like cutting or milling.

In the embodiment of FIG. 8 the composite component is provided with one label only whereas the surface 3 on the lower side of the component is configured by the plastic material 22 itself.

Figure 9:
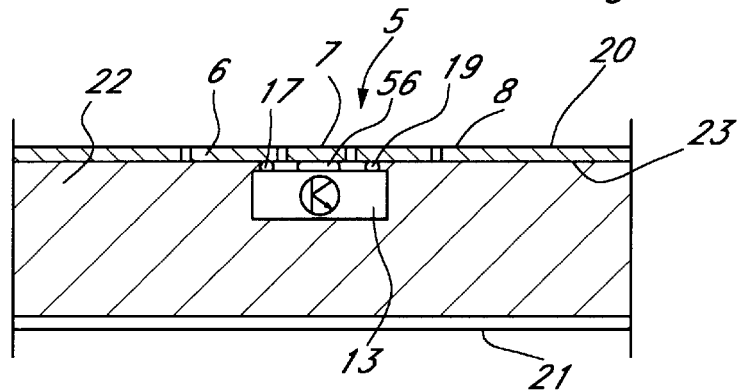
FIG. 9 another embodiment of the invention in which the chip is mounted on a metal foil.

According to another embodiment of FIG. 9 chip 13 is again attached to the inner surface 23 of metal label 20 via its contact bumps 17, 19.

In contrast to the embodiment described with respect to FIG. 8, however, metal label 20 is configured along a plane so that chip 13 with its contact bumps 17, 19 directly adjoins inner surface 23 of label 20. In order to enable a previous attachment of chip 13 to label 20 a glue point 56 is provided between chip 13 and label 20.

Figure 10:
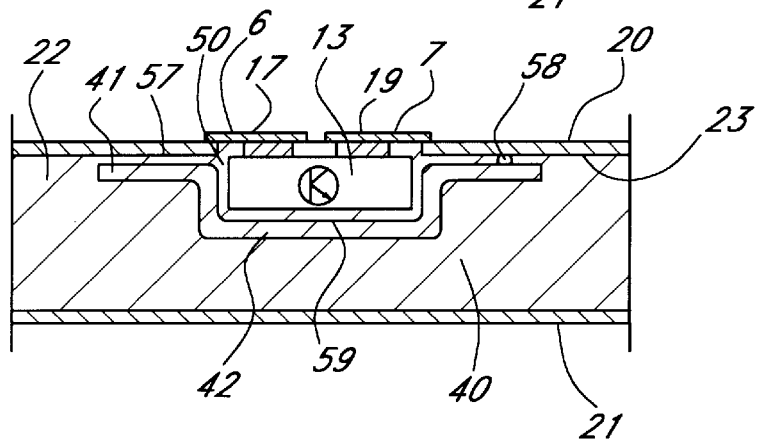
FIG. 10 another embodiment of the invention in which the chip is surrounded by a cup-shaped carrier body being attached to the inner surface of the foil.

According to another embodiment of FIG. 10 chip 13 is surrounded by a cap-shaped carrier body. Carrier body 40 has an edge 41 extending parallel to label 20 and being attached to label 20 via glue points 57, 58. Chip 13 is located below an aperture 50 in label 20 and is entirely surrounded by carrier body 40. A gap between carrier body 40 and chip 13 is repleted with plastic material 22 during injecting.

Chip 13 had previously been attached to bottom 4 via a glue point 49.

For production purposes aperture 15 is first applied to label 20 and chip 13 is then attached to bottom 42 of carrier body 40 by means of the glue point 59. Its contact bumps 17, 19 are extending outwardly. Carrier body 40 is now glued with its edge 41 to inner surface 23 of label 20 by means of glue points 57, 58.

During subsequent injection plastic material 22 flows through the remaining gaps between edge 41 and label 20 and entirely repletes the remaining cavity so that a flush transition is obtained in the area of aperture 50. Contact bumps 17, 19 having a rectangular cross section in the embodiment of FIG. 10, extend somewhat outwardly.

During injection glue points 57, 58, 59 are plastified. After the injection contact segments 6, 7 are generated by printing an electrically conductive paste thereon.

Figure 11:
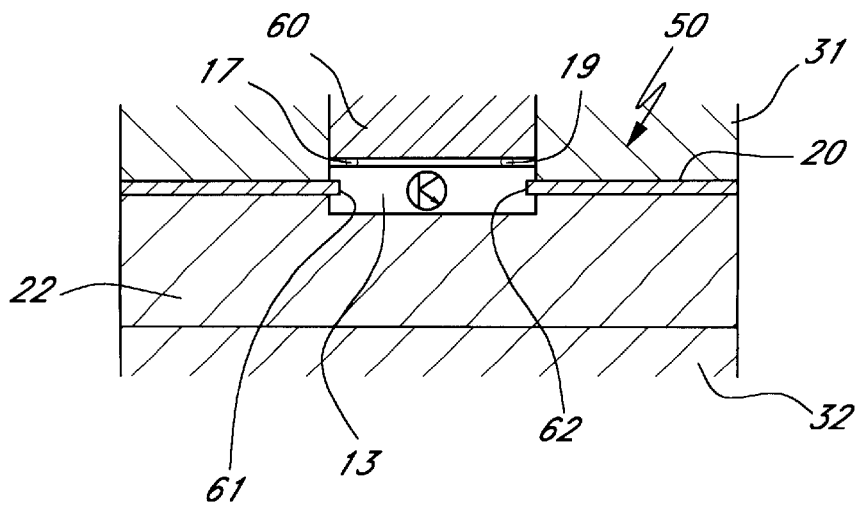
FIG. 11 another schematic view of a further embodiment of the invention.

Another embodiment of the invention is shown in FIG. 11.

Label 20 is again configured as a metal foil having an aperture 50 for chip 13. Chip 13 is provided at its front surface with grooves 61, 62 by means of which chip 13 may be elastically inserted into aperture 50 being somewhat smaller. Chip 13 is, hence, elastically held. For the sake of clarity the illustration of FIG. 11 is somewhat exaggerated.

Contact bumps 17, 19 of chip 13 extend outwardly.

During the injection a stamp 60 of mold portion 31 presses chip 13 into plastic material 22 until chip 13 is essentially flush with label 20.

This elastic attachment of chip 13 to label 20 together with its subsequent impression during injection makes an easy production possible.

It goes without saying that label 20 instead of being made from a metal foil may also be made from a plastic material foil, provided the plastic material foil has sufficient rigidity.

Further embodiments of the invention will be described hereafter with respect to FIGS. 12–15.

Figure 12:
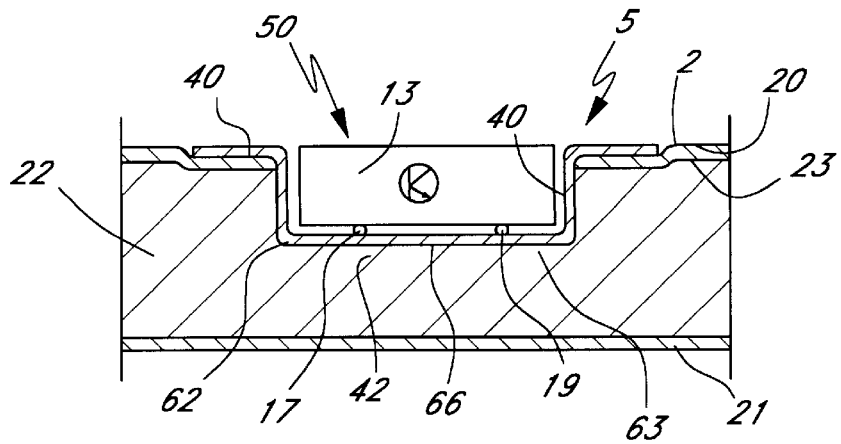
FIGS. 12–15 further embodiments of the invention in a schematic sectional view and on enlarged scale.

In FIG. 12, very much like in FIG. 10, chip 13 is surrounded by a cup-shaped carrier body 40.

However, in contrast to the embodiment of FIG. 10 cup-shaped carrier body 40 is not affixed with its edge 41 to inner surface 23 of label 20. Instead, edge 41 rests on the outside of label 20 and on the edge of aperture 50. Chip 13 and edge 41 of carrier body 40 are essentially flush to surface 2 of label 20.

Carrier body 40 is subdivided into individual contact segments or contact flanges 62, 63 which, according to FIG. 12, are separated in their center by means of an isolation 66. At this instance a segmented metallic carrier body 40 may be used. However, carrier body 40 is preferably made of plastic material and may be metallized along segments.

Carrier body 40 itself helps for establishing an electrically conductive connection between contact bumps 17, 19 engaging bottom 20 of carrier body 40. Hence, edges 41 of carrier body 40 may by themselves be used as a contact area or may subsequently be provided with an electrically conductive coating.

Figure 13:
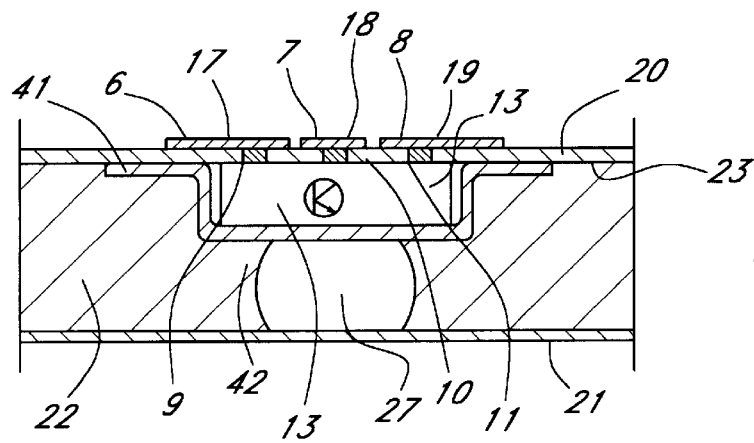

Although the carrier body will protrude from label 20 after having been inserted into aperture 50, it may be arranged subsequently by means of the elevated temperatures within the cavity to become flush with label 20. FIG. 13 shows a modified embodiment as compared with that of FIG. 12.

In contrast to the embodiment of FIG. 12 the cup-shaped carrier body 40 has a label 20 attached to inner surface 23. For that purpose, label 20 had previously been provided with openings 9, 10, 11 as in FIG. 7. Contact bumps 17, 18, 19 of chip 13 extend through openings 9, 10, 11. Chip 13 is attached to inner surface 23 of label 20 by means of carrier body 40 because edge 41 is glued to label 20.

Figure 14:
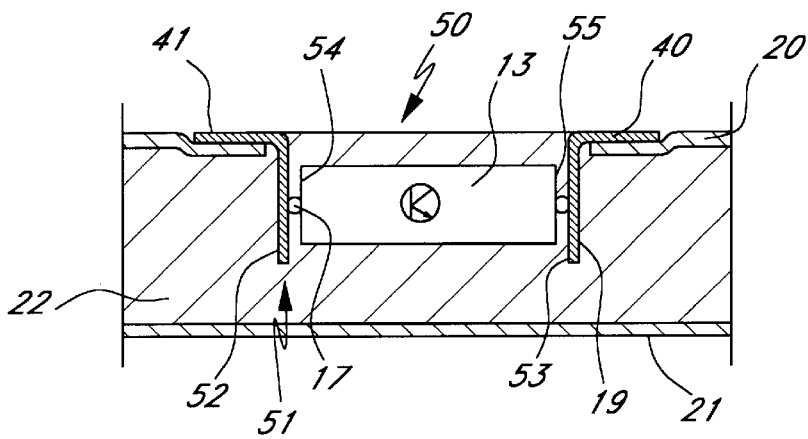

Chip 13, therefore, is entirely shielded against hot plastic material 22 and also mechanically protected during injection. FIG. 14 shows another modified embodiment. Again, an aperture 50 is made in label 20 for allowing to insert a flange-shaped carrier body 50 having an inwardly directing extension 51. Chip 13 with its contact bumps 17, 19 is held between wall surfaces 52, 53 of extensive 51, similar to the arrangement of FIG. 8.

Carrier body 40 with its outer edge 41 rests on the rim of aperture 50 in label 20. The gap between aperture 50, chip 13 and carrier body 40 is again entirely repleted with plastic material 22, resulting in a flush termination in the level of label 20.

Carrier body 40 may also be elastically held within aperture 50. For that purpose aperture 50 may be dimensioned somewhat smaller than extension 51.

Figure 15:
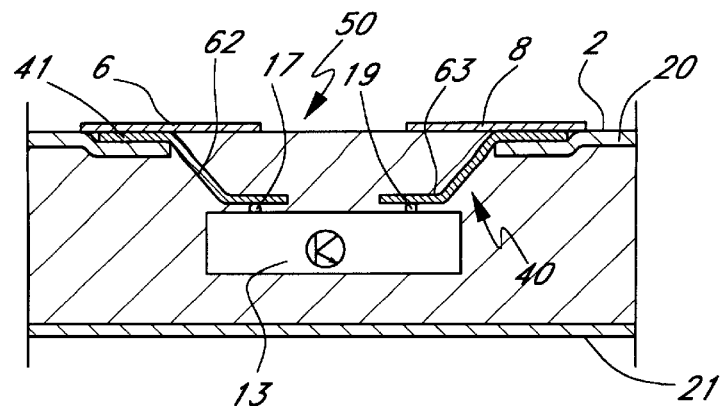

A last embodiment of the invention is shown in FIG. 15. Carrier body 40, similar to the embodiment of FIG. 12, is frusto-conically shaped and, in contrast to the embodiment of FIG. 12, rests with its edge 41 on outer surface 2 of label 20, namely on the rim of aperture 50.

Carrier body 40 is again subdivided into individual contact flanges being electrically conductive and having an inner surface for connection with chip 13 on its contact bumps 17, 19. The connection may be made e.g. by soldering. Carrier body 40 with its edge or color 41 may again be elastically held in aperture 50 of label 20 by clipsing which, however, is not shown in FIG. 15. As an alternative, carrier body 40 may be attached by gluing.

After the termination of the injection, surface 2 of label 20 is provided with a contact area in that an electrically conductive paste is printed thereon and connecting contact flanges 62, 63 of carrier body 40 with contact bumps 17, 19 of chip 13.

I claim:

1. A method for producing a plastic material composite component having a semiconductor ship embedded in said plastic material, the method comprising the steps of:
    providing a plastic material injection mold having a cavity;
    placing said chip in said cavity;
    providing electrical connection elements in said cavity;
    closing said mold;
    injecting molten plastic material into said cavity, thereby embedding said chip in said plastic material and simultaneously arranging said chip and said connection elements such that an electric contact is fixed between said chip and a surface of said cavity when said chip is arranged in said cavity, and during said closing step or injecting step, deforming the electrical connection elements to form said electrical contact.

2. The method of claim 1 wherein said step of fixing includes establishing said contact.

3. The method of claim 1 wherein said step of fixing includes the step of riveting.

4. The method of claim 1 wherein said step of fixing includes the step of soldering.

5. The method of claim 1 wherein said chip is arranged on a label corresponding to a flat side of said component, said chip and said label being inserted into said cavity simultaneously.

6. The method of claim 1 wherein said chip has contact bumps, a contact area being formed on said component and a contact being made between said bumps and said contact area.

7. The method of claim 6 wherein said step of forming said contact area is effected after demolding said chip from said mold.

8. The method of claim 6 wherein said step of forming said contact area is effected prior to attaching said chip to a label, said label corresponding to a flat side of said component.

9. The method of claim 1 wherein said chip is attached to a label corresponding to a flat side of said component, said chip being provided with an array of contact bumps and said label being provided with an array of openings arranged correspondig to said array of bumps for allowing said bumps to extend through said openings and form a contact area on said component when said chip is attached to said label.

10. The method of claim 9 wherein said step of attaching includes the step of soldering said chip to said label.

11. The method of claim 10 wherein said step of soldering includes soldering under the action of heat dissipated by said molten plastic material.

12. The method of claim 1 wherein said chip is mounted on a carrier element, said carrier element being attached to a label corresponding to a flat side of said component.

13. The method of claim 12 wherein said step of attaching includes the step of soldering said chip to said carrier element.

14. The method of claim 13 wherein said step of soldering includes soldering under the action of heat dissipated by said molten plastic material.

15. The method of claim 1 wherein said chip is attached to a label corresponding to a flat side of said component, said label having at least partially a metallic surface.

16. The method of claim 15 wherein said label is configured as a metallic foil.

17. A method for injection-molding a composite component comprising a semiconductor chip embedded in plastic material, said composite component having a surface and contact elements at said surface, said contact elements being electrically connected to said semiconductor chip, the method comprising the steps of:
    providing a plastic material injection mold having a cavity;
    placing said chip in said cavity;
    placing said contact elements in said cavity in loose contact to said chip; and
    injecting molten plastic material into said cavity, thereby embedding said chip in said plastic material,
    wherein said chip and said contact elements are arranged in said cavity such that during injection of said plastic material an electric contact is concurrently fixed with a contact force between said chip and said contact elements at said surface due to pressure exerted by said plastic material on said connection elements.

18. A method for injection-molding a composite component comprising a semiconductor chip embedded in plastic material, said composite component having a surface and contact elements at said surface, said contact elements being electrically connected to said semiconductor chip, the method comprising the steps of:

providing a plastic material injection mold having a cavity;

placing said chip in said cavity;

placing said contact elements in said cavity;

providing electrical connection elements in said cavity between said chip and said contact elements, said electrical connection elements being configured as rivets;

deforming said electrical connection elements to make an electrically conductive riveted connection between said contact elements and said chip; and injecting molten plastic material into said cavity, thereby embedding said chip in said plastic material.

19. A method for injection-molding a composite component comprising a semiconductor chip embedded in plastic material, said composite component having a surface and contact elements at said surface, said contact elements being electrically connected to said semiconductor chip, the method comprising the steps of:

providing a plastic material injection mold having a cavity;

placing said chip in said cavity;

placing said contact elements in said cavity;

providing electrical connection elements in said cavity between said chip and said contact elements, said electrical connection elements being configured as solder bumps; and injecting hot molten plastic material into said cavity, thereby simultaneously embedding said chip in said plastic material and melting said solder bumps for electrically connecting said contact elements to said chip by soldering.

* * * * *